United States Patent [19]
Gorshe

[11] Patent Number: 4,794,604
[45] Date of Patent: Dec. 27, 1988

[54] OPTIMAL ERROR CORRECTION METHOD FOR ZERO BYTE TIME SLOT INTERCHANGE (ZBTSI) CLEAR CHANNEL DATA TRANSMISSION

[75] Inventor: Steven S. Gorshe, Glendale, Ariz.

[73] Assignee: Siemens Transmission Systems, Inc., Phoenix, Ariz.

[21] Appl. No.: 67,901

[22] Filed: Jun. 30, 1987

[51] Int. Cl.⁴ .................. H03M 13/00; H04L 1/00
[52] U.S. Cl. ............................................. 371/57
[58] Field of Search ............................ 371/48, 57, 40

[56] References Cited

U.S. PATENT DOCUMENTS

| | | | |
|---|---|---|---|
| 4,747,098 | 5/1988 | Huang et al. | 370/99 |
| 4,747,112 | 5/1988 | Blondeau, Jr. et al. | 375/20 |

OTHER PUBLICATIONS

IBM Tech. Disclosure Bull., Glick et al., "Single-Error Correction, Double-Error Detection Code...", vol. 15, No. 1, Jun. 1972, pp. 130-134.

*Primary Examiner*—Jerry Smith
*Assistant Examiner*—Stephen M. Baker
*Attorney, Agent, or Firm*—Jeffrey P. Morris

[57] ABSTRACT

A method and circuit for exploiting the characteristics of the ZBTSI algorithm by using the relationship of the data octet and the octets adjacent thereto to detect error conditions such as violations of the DS1 ones density criteria for detection of transmission channel errors in the ZBTSI decoder. This relationship provides an optimized partial error correction technique which minimizes error multiplication in the PCM transmission channels.

18 Claims, 13 Drawing Sheets

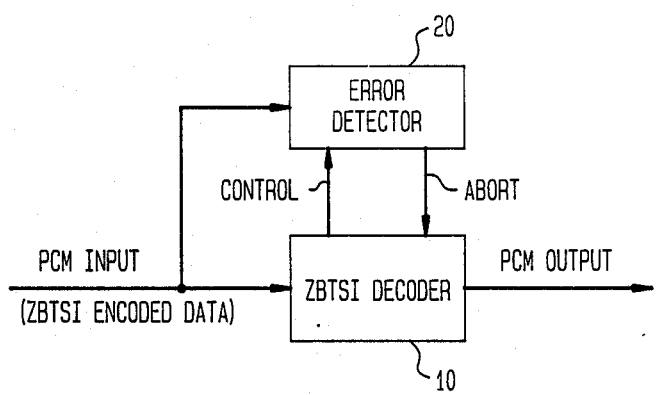
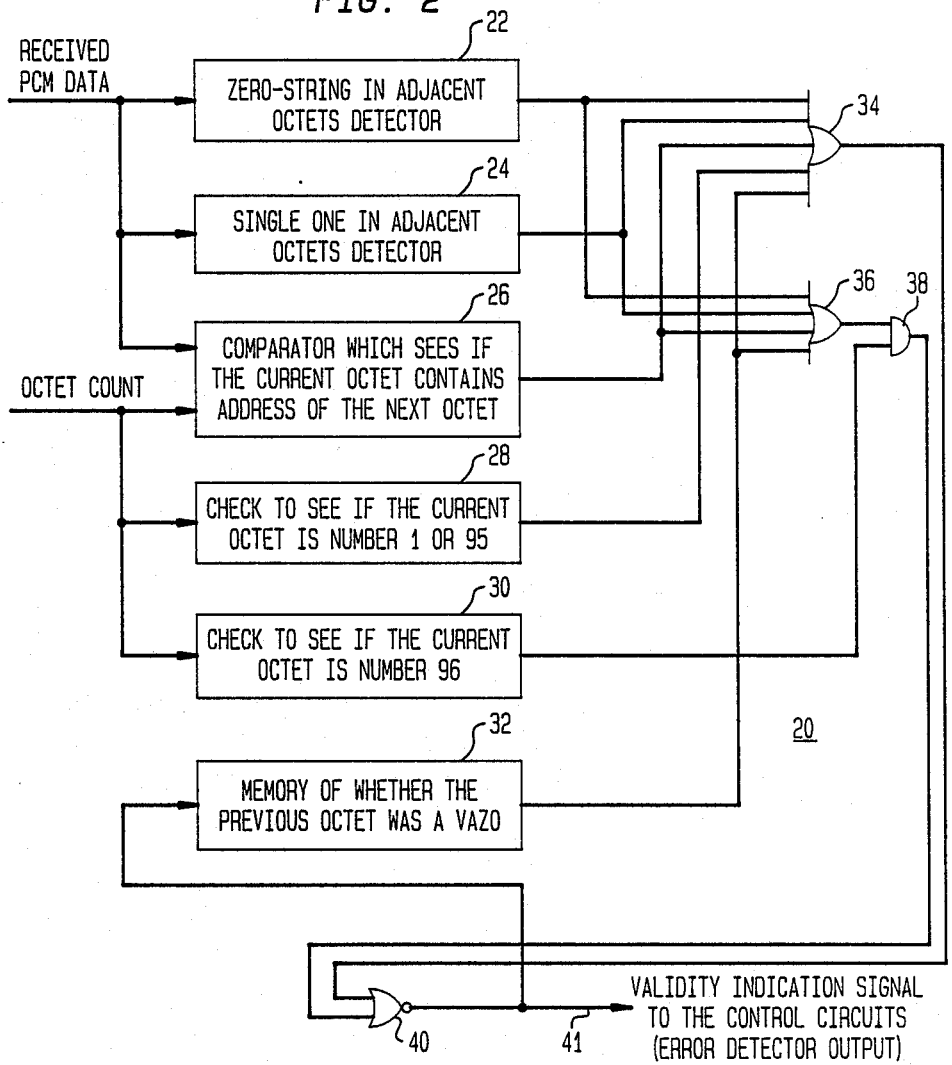

| FIG. 4A | FIG. 4B |

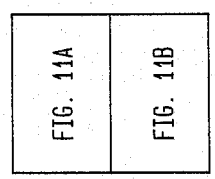
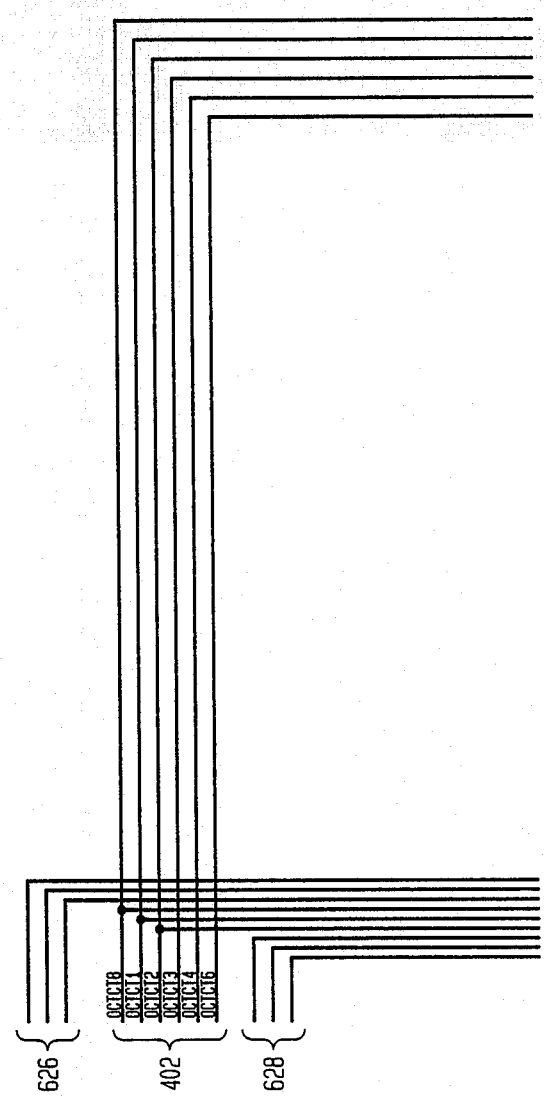
FIG. 11A

FIG. 12

CONDITIONS FOR DECLARATION OF
VIOLATING ALL-ZERO OCTET (VAZO) AT ENCODER

12(A) ZERO STRING | 0 1 0 1 0 0 0 0 | 0 0 0 0 0 0 0 0 | 0 0 0 0 0 0 0 0 | 0 0 0 1 1 1 1 1

12(B) ONES DENSITY | 0 0 0 0 0 1 0 0 | 0 0 0 0 0 0 0 0 | 0 0 0 0 0 0 0 0 | 1 1 0 1 0 0 1 1

12(C) ADJACENT ALL-ZERO OCTETS | 0 0 0 0 0 0 0 0 | 0 0 0 0 0 0 0 0 | 0 0 0 0 0 0 0 0 | 1 1 1 1 0 1 0 1

FIG. 13

VALID VAZO LOCATIONS AT DECODER

13(A) ZERO STRING | 0 1 0 1 1 1 0 0 | 0 1 0 1 0 0 0 0 | 0 0 0 0 0 0 0 0 | 0 0 0 0 0 0 1 1

13(B) ONES DENSITY | 1 1 0 0 0 1 0 1 | 1 0 0 0 0 1 1 1 | 0 0 1 0 0 0 0 0 | 0 0 1 0 0 0 0 0

13(C) ADJACENT ALL-ZERO OCTETS | 0 0 1 1 0 0 0 0 | 1 1 0 1 1 1 1 0 | 1 1 0 1 1 1 1 1

OCTET 47 | OCTET 48

OPTIMAL ERROR CORRECTION METHOD FOR ZERO BYTE TIME SLOT INTERCHANGE (ZBTSI) CLEAR CHANNEL DATA TRANSMISSION

BACKGROUND OF THE INVENTION

1. Field of the Invention

The present invention relates generally to data encoding and transmission techniques for use in telecommunications equipment. More specifically, the present invention relates to an improved encoding and decoding for substantially reducing data error multiplication in transmission and for enabling data transmission without restriction on the quantity and sequence of logic "ones" and "zeros," such that substantially all of the information carrying capability of a communication channel can be effectively utilized.

2. Description of the Prior Art

The Integrated Services Digital Network (ISDN) in its implementation in the North American digital telecommunications transmission network requires a full or unconstrained clear channel capability for 64-kilobit per second (Kb/sec) communication channels. The encoding technique known as Zero-Byte Time Slot Interchange (ZBTSI) is a well known technique for providing clear channel capability, also known as bit-sequence independence over DS1 transmission carrier aacilities within the North American telephone network. At present, the North American telephone network limits the number of consecutive logic "zeros" that can be transmitted because the existing bipolar line code does not transmit any pulses for a logic "zero." As a result, the transmission of long strings of logic "zeros" can cause telecommunications line haul equipment such as multiplexers and protection switches to lose timing accuracy or clock recovery altogether.

As is well known, a single PCM telecommunications channel, known as a "DSO" channel, operates at 64 kilobits per second (Kb/sec) in each direttion of transmission to transmit and receive 8,000 8-bit samples per second of a desired telecommunication, whether voice or data. According to the Bell standard, individual two-way channels are multiplexed into higher speed channels for long distance transmission. As a particular example, 24 8-bit samples, one from each DSO channel, are arranged serially in a single transmission frame together with a single framing bit to form a 193-bit frame.

Transmission of successive 193-bit frames at a rate of 8,000 frames per second determines the bit rate of 1.544 Mb/sec. Set forth in the following table are some of the Bell standard digital transmission lines or hierarchical levels with their associated transmission rates and numbers of channels:

TABLE 1

| Transmission Line | Number of Voice Channels | Transmission Rate |
|---|---|---|
| DSO | 1 | 64 Kb/sec. |
| DS1 | 24 | Approx. 1.5 Mb/sec. |
| DS1C | 48 | Approx. 3 Mb/sec. |
| DS2 | 96 | Approx. 6 Mb/sec. |
| DS3 | 672 | Approx. 45 Mb/sec. |

The standard for digital carrier multiplexers operating to multiplex digital DS1, DS1C and DS2 T carrier transmission lines into a DS3 transmission line is set forth and discussed in the *Bell System Transmission Engineering Technical Reference* entitled "Digital Multiplexers, Requirements and Objectives" by the Director, Exchange Systems Design, AT&T (July, 1982). Digital multiplexers which are connected into the Bell System pulse code modulated T carrier telecommunications network must conform with this standard.

The present North American digital network cannot directly accommodate clear channel capability because of the minimum pulse density restrictions for 1.544 Mb/s DS1 signals and 3.152 Mb/s DS1C signals. The system design convention for T1-type line repeaters requires an average of at least one pulse in eight pulse positions and no more than 15 pulse positions without a pulse. The clock recovery circuit of these repeaters and the receive section of channel banks and other source/sink devices will lose timing accuracy, or timing altogether, in the presence of low logic "ones" density or long strings of logic "zeros." T1C-type repeaters have a similar restriction of at least a $\frac{1}{8}$ pulse density over any 150 consecutive pulse positions.

To satisfy the clock recovery requirements of repeaters and source/sink devices, several design techniques are used to guarantee that devices originating DS1 and DS1C signals do not exceed the aforementioned pulse density constraints. In order to properly encode the highest analog frequency of a voice channel, the sampling rate has been established at 8000 samples per second. This sampling rate is also the frame rate for the DS1 signal. Each sample is encoded into an eight-bit word, which permits the dynamic range of the human voice to be mapped over 256 discrete steps in amplitude. With 8000 samples are per second times 8 bits per sample, the result is 64 Kb/s for each of the individual DSO channels. It is apparent that only the all-zero byte need be restricted, which would offer the ratio 255/256 efficiency, or 99.6 percent of the 64 kb/s channel, as unconstrained information bits for channel users. Unfortunately, existing source/sink devices are not nearly this efficient.

Analog voice signals with associated signaling are coded into the 64 Kb/s channels using a combination of robbed-bit signaling and zero code suppression to guarantee the presence of at least one logic "one" in each byte. For digital data channels, a different technique is employed to ensure that the proper "ones" density is maintained. During transmission of customer digital data, a designated control bit is forced to a logic "one" on a full-time basis. Since the sampling rate remains at 8000 samples per second and there are now only 7 bits per sample available to the channel users, the effective unconstrained information rate to the channel user reduces to 56 Kb/s.

All of the source/sink designs which do not provide for clear channel capability employ at least one of the aforementioned techniques, which reduce the available information bits in the 64 Kb/s channels.

This includes virtually all source/sink devices currently in use in the North American telecommunications network. With the advent of ISDN, some scheme of restoring user access to the full 64 Kb/s channel without restriction on the quantity and sequence of ones and zeros is required. The same requirement exists for all remaining ISDN primary-rate interfaces. The provisioning of clear channel capability requires that new source/sink devices such as PCM terminals allow unconstrained primary-rate digital signals to enter and leave the network intact, and also continue to maintain the minimum pulse density requirements toward line-haul elements. Line-haul elements include repeaters, multiplexers, and automatic protection switches. To this extent, the North American network is not operating with clear channel capability with any of the known prior art techniques currently operational. The clear channel capability function is actually a synthesized condition, converting the clear channel signal to a form which can be transported by the line-haul network elements, then back to the original signal at the far-end source/sink device.

ZBTSI is a known format which allows continued use of a bipolar line code, i.e., an AMI line code, but which does not require any changes to existing telecommunications line haul equipment or to the operation, administration, maintenance and provisioning procedures associated therewith. The first ZBTSI implementation was introduced in 1983 for use in point-to-point nonswitched connections between customer premises equipment locations.

The ZBTSI algorithm operates on contiguous 8-bit channels which correspond in location to the DS0 channels and are referred to here as octets. Each octet is examined in conjunction with the two octets that are adjacent to it. If an octet contains eight logic "zeros" and combines with the adjacent octets to violate the DS1 ones density criteria, then it is processed as a violating All-Zero Octet (VAZO). Specifically, the all-zero octet will be declared a VAZO if it combines with its adjacent octets to form a zero-string of 15 zeros or longer, or if either of the adjacent octets contains less than two logic "ones." The octets are proceseed in groups of 96 and are aligned with the DS1 extended superframe (ESF) format superframe. A flag bit is carried in the frame-bit data link of the ESF format and each flag bit is associated with a 96-octet group. The flag-bit indicates whether a VAZO was found in that 96-octet group. An address chain is constructed using octet 96 and the VAZO locations which allows the VAZOs to be identified at the ZBTSI decoder. As a result of the encoding process, the octets adjacent to every VAZO form a signature around the VAZO.

In accordance with the present invention, a technique is provided whereby the aforementioned signature can be utilized to detect transmission channel errors at a ZBTSI decoder.

Also in accordance with the present invention is the utilization of the aforementioned error detection technique in an optimum partial error correction arrangement to increase the robustnsss of the known ZBTSI coding algorithm by at least a factor of four for random input data and by a greater factor when the input data is a steady logic "zero" or a steady string of "ones."

A novel ZBTSI decoder using the optimum partial error correction technique of the present invention is also described.

SUMMARY OF THE INVENTION

A method and circuit for exploiting the characteristics of the ZBTSI algorithm by using the relationship of the data octet and the octets adjacent thereto to detect error conditions such as violations of the DS 1 ones density criteria for detection of transmission channel errors in the ZBTSI decoder. The use of this relationship for an optimized partial error correction technique which minimizes error multiplication in the transmission channel is described.

BRIEF DESCRIPTION OF THE DRAWINGS

FIG. 1 is a simplified representation of the interaction between a ZBTSI decoder and an error detector in implementing partial error correction.

FIG. 2 is a simplified functional representation of an error detector circuit in accordance with the present invention.

FIGS. 11, 11(A) and 11(B) are a circuit diagram of additional control logic in accordance with the present invention.

FIG. 12(A) (B) and (C) shows representations of VAZO conditions useful in describing the invention.

FIG. 13(A) (B) and (C) shows representations of valid VAZO locations useful in describing the invention.

DESCRIPTION OF THE PREFERRED EMBODIMENT

Figure 3:
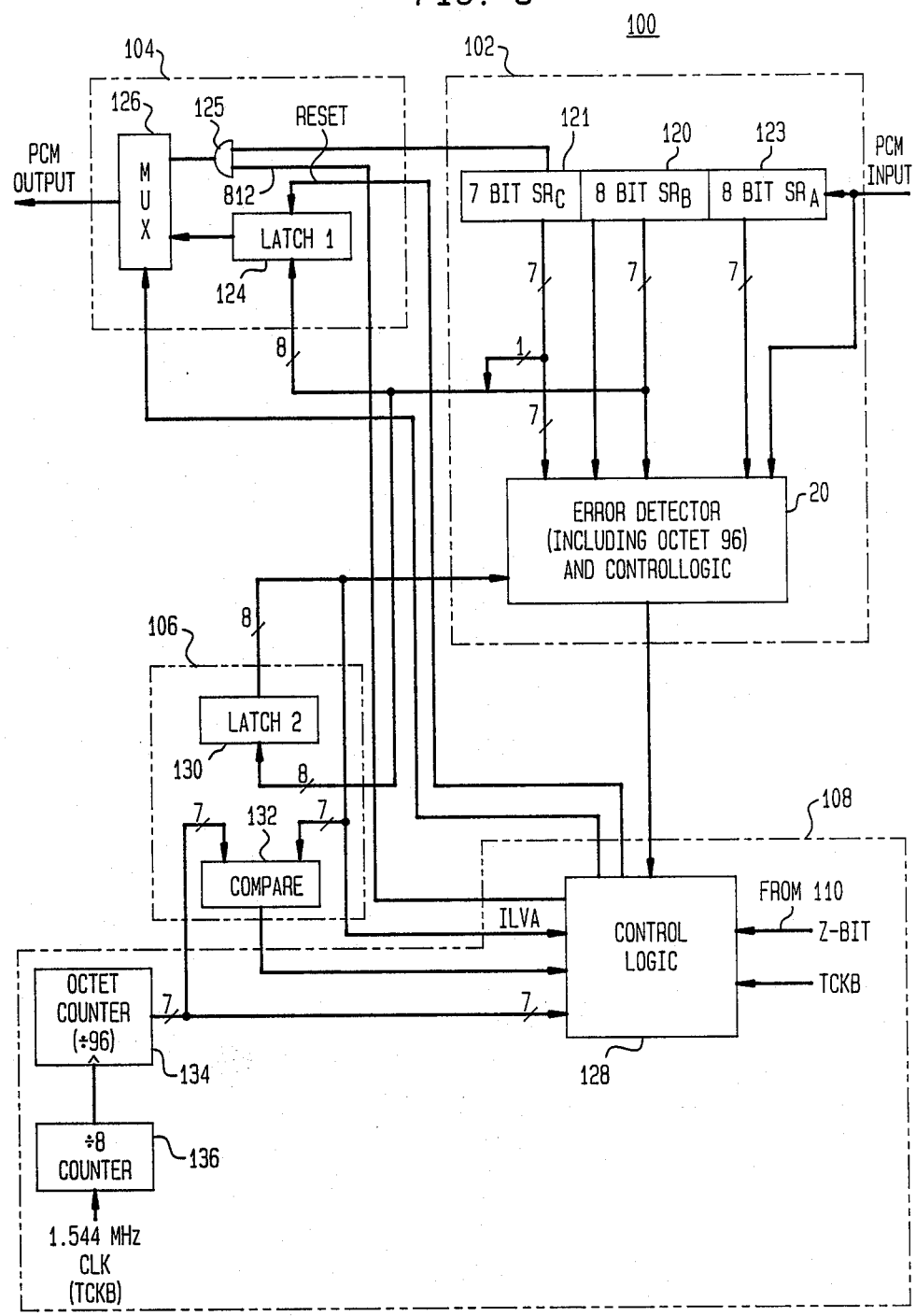
FIG. 3 is a block diagram of the decoder and error detector of the present invention.

The ZBTSI algorithm performs its processing at a logic level rather than operating directly on the final line code, and regards each DS1 frame as comprised of 24 8-bit channels plus a framing bit in the first bit position. The channelization of the data within the frame is independent of the ZBTSI algorithm. The ZBTSI encoder operates on blocks of 96 8-bit channels, which is four DS1 frames. Each 8-bit channel is called an octet and the ZBTSI algorithm numbers them from 01 to 96. A ZBTSI processing indicator flag bit, the Z-bit, is associated with each 96-octet group and is transmitted at the beginning of each 96-octet group. The Z-bit is carried in 2 kb/s of the extended superframe (ESF) frame bit data link. The assignment of frame bits (F-bits) in the ESF with ZBTSI encoding is shown in the table below where:

FPS is the Framing Pattern Sequence
FDL is the Frame Data Link (message bits m)
ZBTSI is ZBTSI encoding flag bits (Z-bits)
CRC is Cyclic Redundancy Check

TABLE 2

| FRAME NO. | BIT NO. | FRAME BIT DEFINITIONS | | | |
|---|---|---|---|---|---|
| | | FPS | FDL | ZBTSI | CRC |
| 1 | 0 | — | — | Z | — |
| 2 | 193 | — | — | — | C1 |
| 3 | 386 | — | m | — | — |
| 4 | 579 | 0 | — | — | — |
| 5 | 772 | — | — | Z | — |
| 6 | 965 | — | — | — | C2 |

TABLE 2-continued

| FRAME NO. | BIT NO. | FPS | FDL | ZBTSI | CRC |
|---|---|---|---|---|---|
| 7 | 1158 | — | m | — | — |
| 8 | 1351 | 0 | — | — | — |
| 9 | 1544 | — | — | z | — |
| 10 | 1737 | — | — | — | C3 |
| 11 | 1930 | — | m | — | — |
| 12 | 2123 | 1 | — | — | — |
| 13 | 2316 | — | — | z | — |
| 14 | 2509 | — | — | — | C4 |
| 15 | 2702 | — | m | — | — |
| 16 | 2895 | 0 | — | — | — |
| 17 | 3088 | — | — | z | — |
| 18 | 3281 | — | — | — | C5 |
| 19 | 3474 | — | m | — | — |
| 20 | 3667 | 1 | — | — | — |
| 21 | 3860 | — | — | — | — |
| 22 | 4053 | — | — | — | C6 |
| 23 | 4246 | — | m | — | — |
| 24 | 4439 | 1 | — | — | — |

The basic principle of the ZBTSI algorithm can be summarized as follows. The PCM data, except for the F-bits, is scrambled by a frame-synchronized scrambler as it enters the ZBTSI encoder and is descambled as it exits the ZBTSI decoder. First, the data is searched on an octet-by-octet basis in order to determine whether the DS1 maximum zero string or minimum ones density requirements is violated. If either of the aforementioned requirements is violated, an address chain is constructed to locate all of the all-zero octets involved. The addresses are then inserted into the locations of the all-zero octets. One of the octets, octet 96, is displaced in order to provide a constant storage location for the first address. The original value of octet 96 is stored in the location of the last all-zero octet. The final step of the ZBTSI encoding process is to set the Z-bit to the appropriate value. The ZBTSI decoder simply reverses the process performed at the encoder. The decoder may also perform partial error detection and correction. Scrambling in telecommunication data transmission is well known, and reference can be made for detailed descriptions of such scramblers, by way of example, to U.S. Pat. No. 3,649,915; Digital Data Scrambler—Descrambler Apparatus for Improved Error Performance. The ESF cyclic redundancy check is calculated before the ZBTSI encoder stage at a DS1 signal source and is calculated after the ZBTSI decoder at a DS1 sink device.

From the ZBTSI algorithm it is apparent that a transmission channel error which affects a flag-bit (Z-bit), a VAZO address, or an ILVA bit may cause additional errors to occur (error multiplication) as the decoder uses this erroneous information. The address of an octet is its octet number and is carried as a binary number in the 7 least significant bits of an address-bearing octet. The most significant bit carries the indicator of the last VAZO address (ILVA). Error multiplication also occurs with certain scramblers and line codes. Single-bit errors with a Gaussian distribution over the bit stream are common on DS1 carrier facilities. It is these single-bit errors which cause the most noticeable error multiplicaton and are the only type of errors that can be corrected effectively. It may be assumed that the bit error rate (BER) due to the transmission channel alone is no worse than 1/10,000.

The superframe-synchronized scrambler does not add to the error multiplication. The exemplary calculations hereinafter are based on an assumption of random data, which occurs due to the scrambling. The likelihood of the incoming data interacting with a superframe-synchronized scrambler in such a manner as to consistently create long data zero strings is minimal. When a steady string of zeros or a steady string of ones is transmitted over the entire 1.536 Mb/s information channel of a DS1, the scrambling guarantees that no VAZOs will be declared. Such steady zero or one strings are frequently used as "idle" codes between data transmissions. With the assumption of random data, the performance the ZBTSI algorithm may be calculated using Bernoulli trials and the binomial distribution function, as will be described in the exemplary calculations.

On the average, no VAZOs will be declared in 97.9 percent of the 96-octet groups, and a single VAZO will be declared in 2.05 percent of the groups. The very high probability that no VAZOs will be declared in a 96-octet group suggests the conclusion that any errors detected at the decoder can be assumed to be Z-bit errors. The exemplary calculations prove this hypothesis. The first octet received by the decoder in every 96-octet group will either be octet 96 or the address of the first VAZO in the group. If this first octet value is always saved for insertion as the contents of octet 96 when an error is detected and the processing of the address chain is aborted when an error is found, then the error multiplication will be minimized. The resulting error multiplication value will be:

$$EMF = 1.004 \times BER$$

where BER is the bit error rate of the transmission channel alone. In other words, with optimal partial error correction in accordance with the present invention, the standard ZBTSI algorithm can add as little as 0.4 percent to the system BER. For constant zero or "one" string idle codes, this partial error correction method will virtually eliminate error multiplication.

Given the assumption of a random data output from the ZBTSI encoder scrambler, a binomial distribution may be used. The probability of any octet containing 8 zeros now becomes:

$$PO = \tfrac{1}{2}^8 = 0.0039 \qquad \text{Eq. 1}$$

The probability that either octet 1 or octet 95 is declared a VAZO is equal to PO. For any other all-zero octet to be declared a VAZO, the adjacent octets must combine with that octet to either violate the ones density requirement or potentially violate the zero string requirement. The probability that adjacent octets will combine with an all-zero octet to form a zero string of at least 15 bits is found to be:

$$Paz = (\tfrac{1}{2}^7) + (7)(\tfrac{1}{2}^8) = 0.0352 \qquad \text{Eq. 2}$$

The probability that either adjacent octet contains a single "1" is:

$$Pao = (2)(\tfrac{1}{2}^8)[\tfrac{1}{2}^7 + \tfrac{1}{2}^6 + \tfrac{1}{2}^5 + \tfrac{1}{2}^4 + \tfrac{1}{2}^3 + \tfrac{1}{2}^2 + \tfrac{1}{2}] \qquad \text{Eq. 3}$$

$$Pao = 0.0078 \qquad \text{Eq. 4}$$

The total probability that an octet other than octet 1 or octet 95 will be declared a VAZO is thus:

$$Pvo = (PO)(Paz + Pao) = 0.00017 \qquad \text{Eq. 5}$$

With this information, the probability of "n" VAZOs occurring in a 96-octet group may be determined.

$$P0vazo = (1 - Pvo)^{9\cdot4}(1 - P0)^2 \qquad \text{Eq. 6}$$
$$P0vazo = 0.976 \qquad \text{Eq. 7}$$

$$P1vazo = \binom{94}{1}(Pvo)(1-Pvo)^{9\cdot3}(1-P0)^2 + \qquad \text{Eq. 8}$$
$$(2)(1-Pvo)^{9\cdot4}(1-P0)(P0)$$
$$P1vazo = 0.0232 \qquad \text{Eq. 9}$$

$$P2vazo = \binom{94}{2}(Pvo)^2(1-Pvo)^{9\cdot2}(1-P0)^2 + \qquad \text{Eq. 10}$$
$$(2)\binom{94}{1}(Pvo)(1-Pvo)^{9\cdot3}(P0)(1-P0) + (1-Pvo)^{9\cdot4}(P0)^2$$
$$P2vazo = 0.00026 \qquad \text{Eq. 11}$$

The notation $\binom{n}{k} = \dfrac{n!}{k!(n-k)!}$

The decoder is assumed to examine each octet location to determine if that octet could have been declared a VAZO at the encoder. This examination is based on the values in the adjacent octets. The average probability that an octet location appears to be a valid VAZO location at the decoder is found by:

$$Pvld = (1/96)[(94)(Paz + Pao + 0.0039) + 2] \qquad \text{Eq. 12}$$
$$Pvld = 0.0668 \qquad \text{Eq. 13}$$

where the probability is averaged over all 96 octets. The octet under examination may also be a VAZO if the octet immediately preceding it contains the address of the octet under examination. The 0.0039 term above accounts for this case.

If the decoder aborts VAZO processing immediately after an error is detected, it can be shown that there are only four cases which will contribute substantially to the error multiplication. Only these four cases are illustrated hereinafter.

Case 1: No VAZOs occurred, but the Z-bit was corrupted by a transmission channel error to indicate that VAZOs are present. The first octet after the Z-bit (octet 96) contains an address that points to an octet location that appears valid and indicates that this is the last VAZO in the group.

$$Pc1 = (P0vazo)(\tfrac{1}{2})(Pvld)(96/128)(16)(\tfrac{1}{2})(1/772) \qquad \text{Eq. 14}$$
$$Pc1 = 0.0002 \qquad \text{Eq. 15}$$

In Equation 14, the second factor accounts for the probability of the bit in the ILVA position, indicating that this address is associated with the last VAZO. The fourth factor takes into account that only 96 of the 128 possible addresses from the 7-bit address field are actually used. The fifth factor represents the 16 bits affected in octet 96 and the addressed octet. The sixth factor accounts for the fact that on the average, only ½ of the bits in the affected octets will actually be received in error. The final factor normalizes Z-bit errors against errors in any of the 768 information bits in 96-octet group and the 3 other F-bits that are carried along with it. Errors in these other bits do not cause error multiplication.

Case 2: One VAZO occurs and an error corrupts the first address such that it points to an invalid location. The decoder will abort processing and both the VAZO and octet 96 will be affected.

$$Pc2 = (P1azo)(1/127)[32 + (1-Pvld)(95)](16)(\tfrac{1}{2})(7)(1/772) \qquad \text{Eq. 16}$$
$$Pc2 = 0.0016 \qquad \text{Eq. 17}$$

The second and third factors of Equation 16 account for the probability that the corrupted address points to a location that is considered invalid by the decoder. There are only 95 addresses out of 128 that will potentially appear to be valid. The fourth, fifth, and last factors in Equation 16 represent the same considerations as the fifth, sixth, and last factors of Equation 14 respectively. The sixth factor in Equation 16 accounts for the 7 address bits in which the error could have occurred.

Case 3: A single VAZO occurs and an error corrupts one of the octets adjacent to the VAZO such that the VAZO location will no longer appear valid to the decoder. First, the average number of bits vulnerable to such an error must be determined.

$$Px = [(Paz)(7) + (Pao)(14)](94/96)/(Paz + Pao) \qquad \text{Eq. 18}$$
$$Px = 8.10 \qquad \text{Eq. 19}$$
$$Pc3 = (P1vazo)(16)(\tfrac{1}{2})(Px)(1/772) \qquad \text{Eq. 20}$$
$$Px3 = 0.0019 \qquad \text{Eq. 21}$$

Case 4: A single VAZO occurs and an error corrupts the Z-bit. The decoder thus performs no decoding.

$$Pc4 = (P1vazo)(16)(\tfrac{1}{2})(1/772) \qquad \text{Eq. 22}$$
$$Pc4 = 0.0002 \qquad \text{Eq. 23}$$

It can be seen that these four cases are the only significant contributors to the error multiplication when the following observations are made. First, when no VAZOs occur, only undetectable Z-bit errors actually cause error multillication. Case 1 covers the most likely undetectable Z-bit error. The next most likely Z-bit error involves having two "addresses" which appear to be valid addresses is much smaller than the probability of a single valid address. Hence, the added error multiplication from these cases is negligible. Second, when a single VAZO is declared, the probability that significant error multiplication will result from following an erroneous address chain is negligible for the reasons discussed when no VAZOs occurred. Third, the probability that two or more VAZOs will occur is small enough that the error multiplication from these cases will also be negligible.

The average total error multiplication for ZBTSI is thus:

$$EMFz = (1 + Pc1 + Pc2 + Pc3)(BER) \qquad \text{Eq. 24}$$
$$EMFz = 1.004 \times BER \qquad \text{Eq. 25}$$

There are other alternatives that the decoder may follow when an error is detected. The most reasonable action, other than aborting after the first error, is to abort only after the second error. Case 3 above would then go away, cases 2 and 4 would remain unchanged, and case 1 would be increased by the inverse of Pvld. Other cases would also become more iignificant. The end result of the two courses of action would be close, but aborting after the first error will still produce the lower error multiplication. All other actions would likewise increase the error multiplication.

Referring now to FIG. 1, a block diagram of the interaction between a ZBTSI decoder 10 an an error detector 20 in accordance with the present invention is shown. Control information is exchanged to ensure that the error detector 20 is operating upon the correct data. When an error is detected in the VAZO 20 chain, the error detector 20 signals the decoder 10 to abort the decoding process FIG. 2 illustrates a functional block diagram of the operation of the error detector 20. Essentially, the incoming pulse code modulated (PCM) data is received at detector 22 and 24 for detecting respectively a zero-string in adjacent octets and a single logic "one" in adjacent octets, and is also received at comparator 26 for determining whether the current octet contains the address of the next octet, by comparing the PCM octets with the octet count. The octet count is also received by logic 28 to determine whether the current octet is octet number 1 or octet number 95. The logic 30 determines whether the current octet is octet number 96. A memory 32 stores data indications of whether the previous octet was a VAZO. The gating arrangment of OR gates 34 and 36 and AND gate 38 functions to produce a "true" or logic "one" signal from NOR gate 40 when the aforementioned conditions in any of logic circuits 22, 24, 26, 28, 30, or 32 is true. Thus, whenever the decoder 20 indicates that an error has occurred, i.e. that the VAZO location is not valid as indicated by a logic "zero" out from logic blocks 22, 24, 26, 28, 30 and 32, the decoder 10 will abort the decoding process.

The circuit described with reference to FIG. 2 has been implemented in 2-micron CMOS. The outputs of each of the blocks in the CMOS implementation are the logical inverse of the output of FIG. 2.

The "zero" string in adjacent octet detector 22 is implemented with a 23-bit shift register, eight 7-input NOR gates and an 8-input NOR gate. The inputs to eight of the NOR gates are the outputs of the shift register stages. The NOR gates are used to scan the PCM data for zero strings as it transits the shift register. The middle eight stages of the shift register contain the current octet which is being examined to ee if it could be a valid VAZO location. If the encoder declared the octet a VAZO based on a zero string of 15 or longer, the last bits of the previous octet and the first bits of the next octet should combine to form a zero string of at least 7 zeros (15−8=7). The 7-input NOR gates check the eight possible combinations in which the 7 zero string in the adjacent octets could appear. The outputs of these NOR gates are the inputs to the 8-input NOR gates. When a valid 7-zero string is found, the output of the 8-input NOR gate is "zero." Otherwise the output is a "one."

The "single one in adjacent octet detector" 24 is implemented as a pair of two stage counters. One counter examines the previous octet and the other examines the next octet with the inputs to the counters being output stages from the 23-bit shift register described above. The counters are reset by a control signal at the beginning of each octet. When the first logic one is encountered in an octet, the first stage of the counter toggles and holds its value until it is reset. The second stage toggles when the second logic one is found in the octet and likewise holds its value until it is reset. If the second stage remains untoggled in either of the counters after all eight bits have been examined, there is a single one or less in an adjacent octet and the current octet location is a valid VAZO location based on ones density. A logic zero may represent an untoggled output in an actual implementation.

The "comparator which sees if the current octet contains the address of the next octet" 26 is implemented with a 7-bit latch, an adder circuit, seven exclusive OR (XOR) gates and a NOR gate. When the encoder finds two consecutive all-zero octets, it will declare both of them VAZOs and hence the first of hhe two will contain the address of the second aftr encoding. The 7-bit latch contains the values of the current octet, which are loaded in parallel from the 23-bit input shift register. A binary value of 0000001 is added to the number of the current octet using a full adder that was simplified for this one operation. The current octet number is kept by the master control counter chain and is used in various places in the decoding process. The output of the adder is then compared on a bit-by-bit basis with the output of the 7-bit latch with XOR gates. The outputs of the XOR gates are summarized with a NOR gate. The output of the NOR gate will be a logic one if the current octet location is indeed the value of the next octet location. If Octet 96 is the current octet, then the next octet is actually Octet 1. A pair of AND gates on the two high order comparator bits (XOR outputs) are used to compensate for this fact. The NOR gate which receives the XOR outputs must also have the ILVA-bit as an input. If the current octet has been indicated as the last VAZO by the ILVA-bit, then the current octet cannot be considered a valid location by pointing to the next octet location. The output of the NOR gate is inverted before input to the final condition summary in order to be consistant with the output of the other blocks.

Referring to FIG. 3, a simplified block diagram of the decoder 10 and error detector 20 is illustrated generally at 100. A PCM input 102 scans the PCM input to check for errors in ZBTSI encoding. The current octet at the middle 8-links of shift register 120 and two adjacent octets at shift register sections 121 and 123 are all examined. Octet 120 is ignored by the error detector 20. Octet 96 in latched and held at latch 124. All bits of octets out are set to zero at AND gate 125. MUX 126 selects whether octet 96 or any other octet is outputed. The control signal 108 generates all the enable signals. A declared VAZO causes logic 128 to latch the latches 124 and 130 and comparator 132 compares the address value in latch 130 with the current octet count at counter 134. Thus, when the current adddress and the octet count are the same, the middle location octet at register 120 is the location of the VAZO. Thus, the output of error detector 20 is checked to determine if the octet at 120 is a valid location for a VAZO. If "yes," then the octet at 120 will be masked out to "all zeros" and outputed from multiplexer 126. The MSB of the latch 130 indicates if more VAZO's are to follow (the ILVA bit). If "yes," the contents of register 120 are latched to latch 130, and the process rs repeated. If the octet at 120 is not a valid VAZO location, the processing is aborted and no new values are placed in latch 130, the output of comparator 132 is ignored, the value in latch 124 is assumed to be octet 96 and no octets will be masked to "all zeros" for the rest of the group of 96 octets. By aborting processing, the data in the group of 96 octets is transmitted out unprocessed. By not aborting in processing, only good address chains are processed—the aborting of processing for known VAZO errors eliminates the processing of errneous data. The processing restores the data to the original values that entered the encoder, so that the data can pass through the network, i.e. by eliminating "all zero" octets.

Figures 4, 4A:
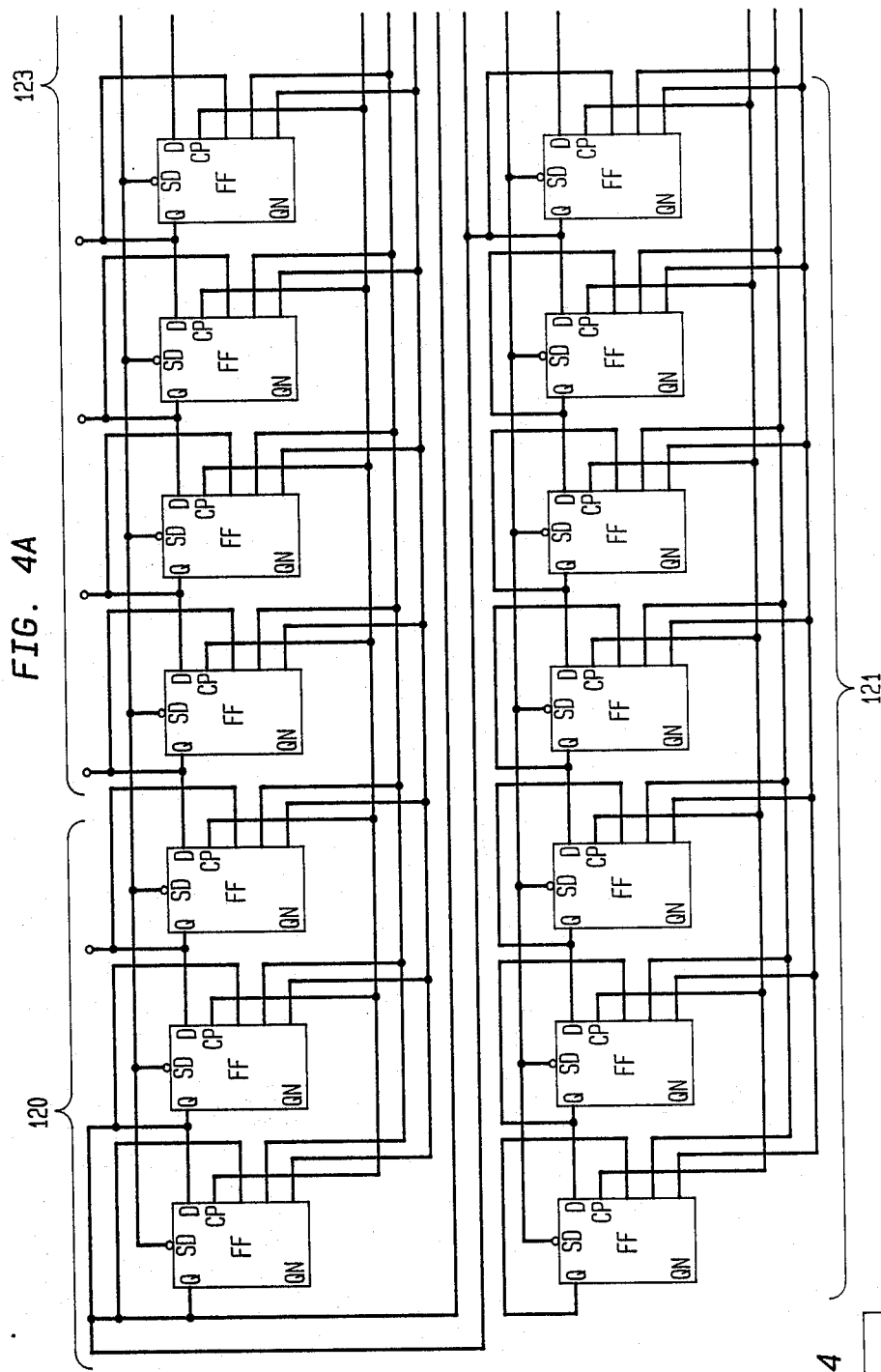
FIGS. 4, 4(A) and 4(B) are a circuit diagram of a shift register configuration in accordance with the present invention.
Figure 4B:
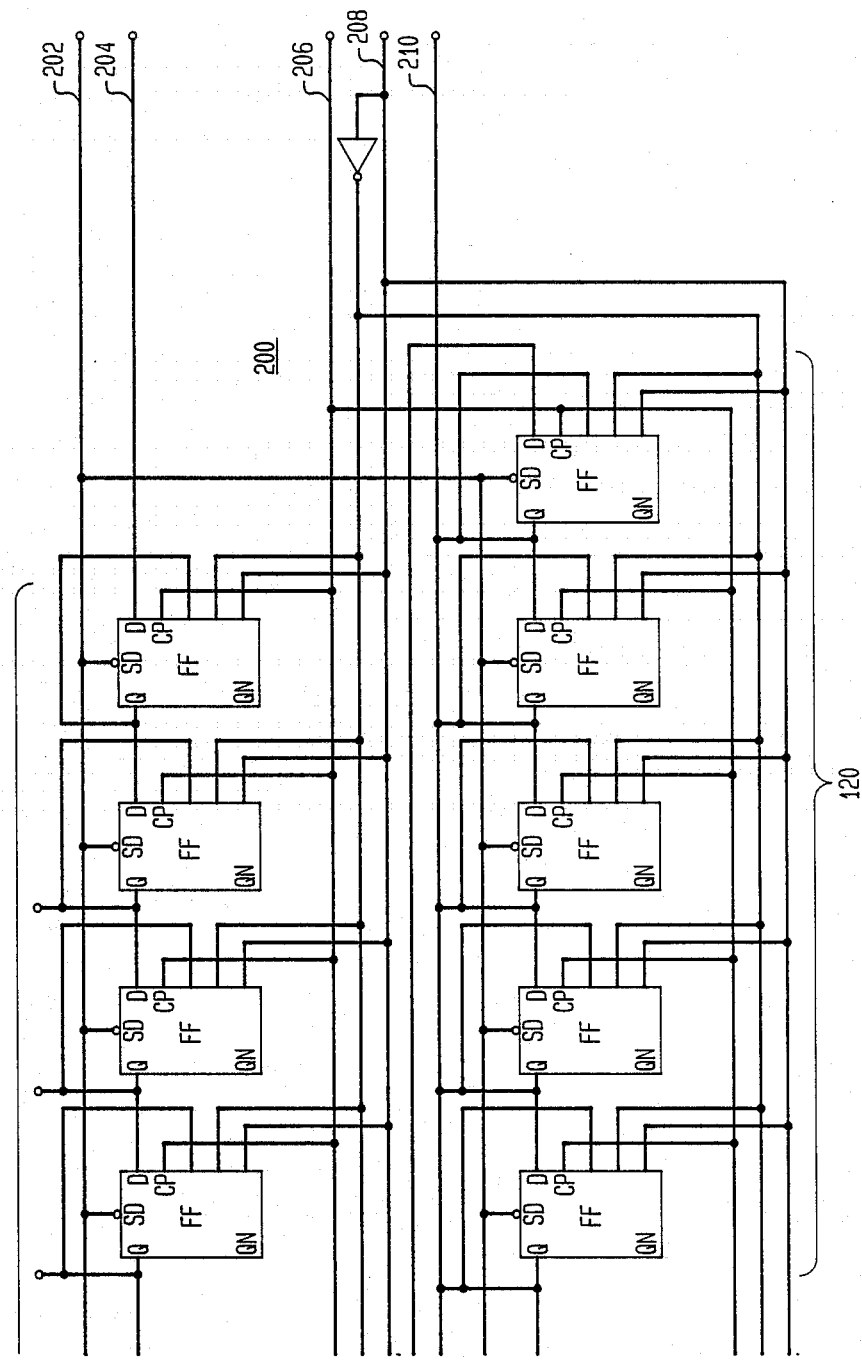

FIG. 4 shows the 23-bit shift register 102 in 2-micron CMOS at 200. A reset input is shown at 202, PCM input data at 204, data clock input at 206, a frame synchronization pulse at 208 and a parallel bus for extracting PCM data from registers 120 and 121 is shown at 210. Flip flops are arranged as register 120, 121 and 123 as illustrated. During the frame synch pulse on 210, the flip flop inputs are scanned to eliminate F bits, so that only PCM data is clocked in. TI (test input), TE and TEN (test enable and test enable (inverse) inputs) are present but for simplicity of description are not described. The output from 210 is PCM data to latch 130. The outputs Q from each flip flop are coupled to the error detector 20.

Figure 5:
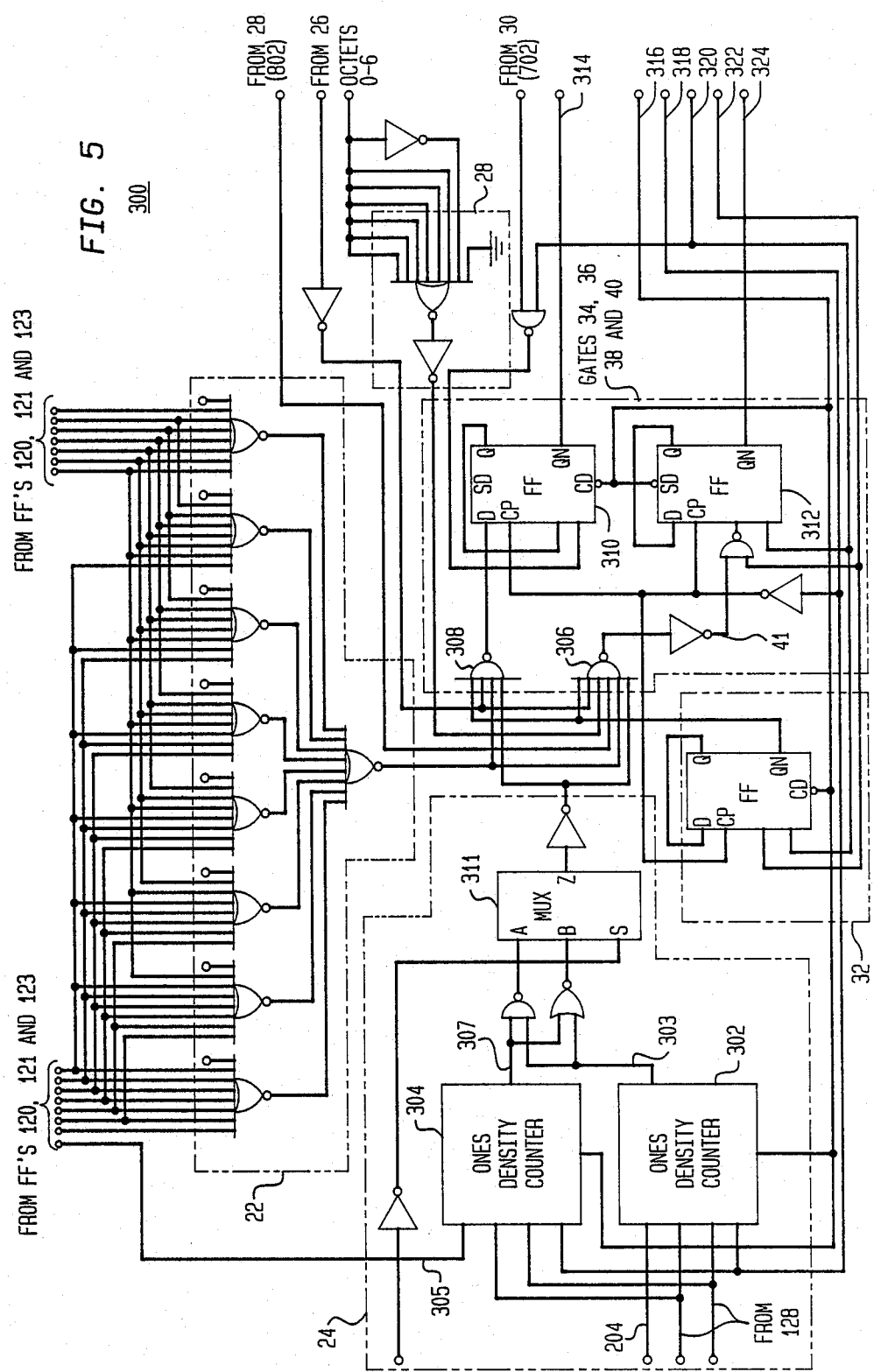
FIG. 5 is a circiit diagram of an error detector in accordance with the present invention.

The error detector 20 is illustrated generally at 300 in 2 micron CMOS by FIG. 5. The outputs of the flip flops 120, 121 and 123 are coupled to the zero string and ones density circuits. The zero strings are checked by NOR gates at 22. The single "ones" in adjacent octets are detected at 24 by a ones density counter 302 for the octet at register 123 and ones density counter 304 examines the octet at register 121. The outputs of 22 and 24 are NAND'ed as shown at NAND gates 306, 308 and flip flop 310 which retains an indication of the validity of octet 96 location, and flip flop 312 indicates whether thereiis an erroneous VAZO address. Output 314 indicates the validity of the octet 96 location. Initilization is provided at reset input 316. The data clock at 318 corresponds to input 206 of FIG. 4. Input 320 from control logic 128 provides an indication of when to make the decision as to whether there has been a VAZO error. The output of comparator 132 is at 322. The error detector 20 output is shown at 324.

Figure 6:
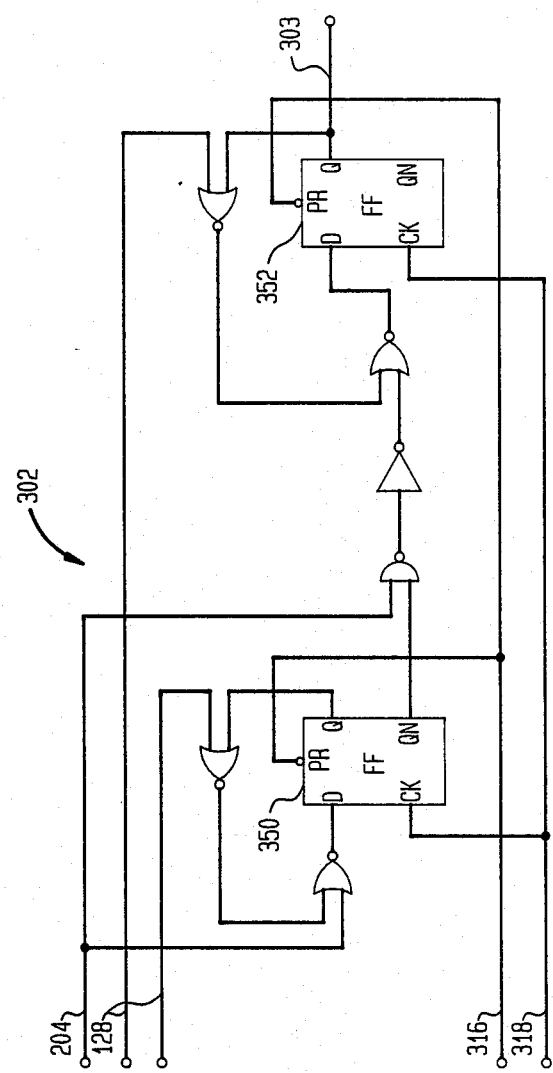
FIG. 6 is a circuit diagram of a ones density counter circuit useful in connection with the present invention.

FIG. 6 illustrates the ones density counter logic which is used for counters 302 and 304 shown in FIG. 5. PCM data from line 204 and control inputs from 128, reset for initialization on 316 and a data clock 318 are coupled in. Flip flops 350 and 352 are reset by the control inputs 128. Flip flop 350 toggles from the reset value when the first logic "one" is encountered in the input data stream 204, and holds its value until it is reset. Flip flop 352 toggles during the second logic "one" in the data stream 204, and holds its value until it is reset. Thus whether or not there are less than two logic "ones" in adjacent octets is determined, and this information is coupled out on line 303. The input to 304 is the PCM input from register 120 on line 305. The other inputs are as shown. Ones density counter 304 is configured identically as is counter 302 of FIG. 6, and has its output on line 307. The outputs on lines 303 and 307 are multiplexed at multiplexer 311 and coupled to NAND gates 306 and 308 as shown.

Figure 7:
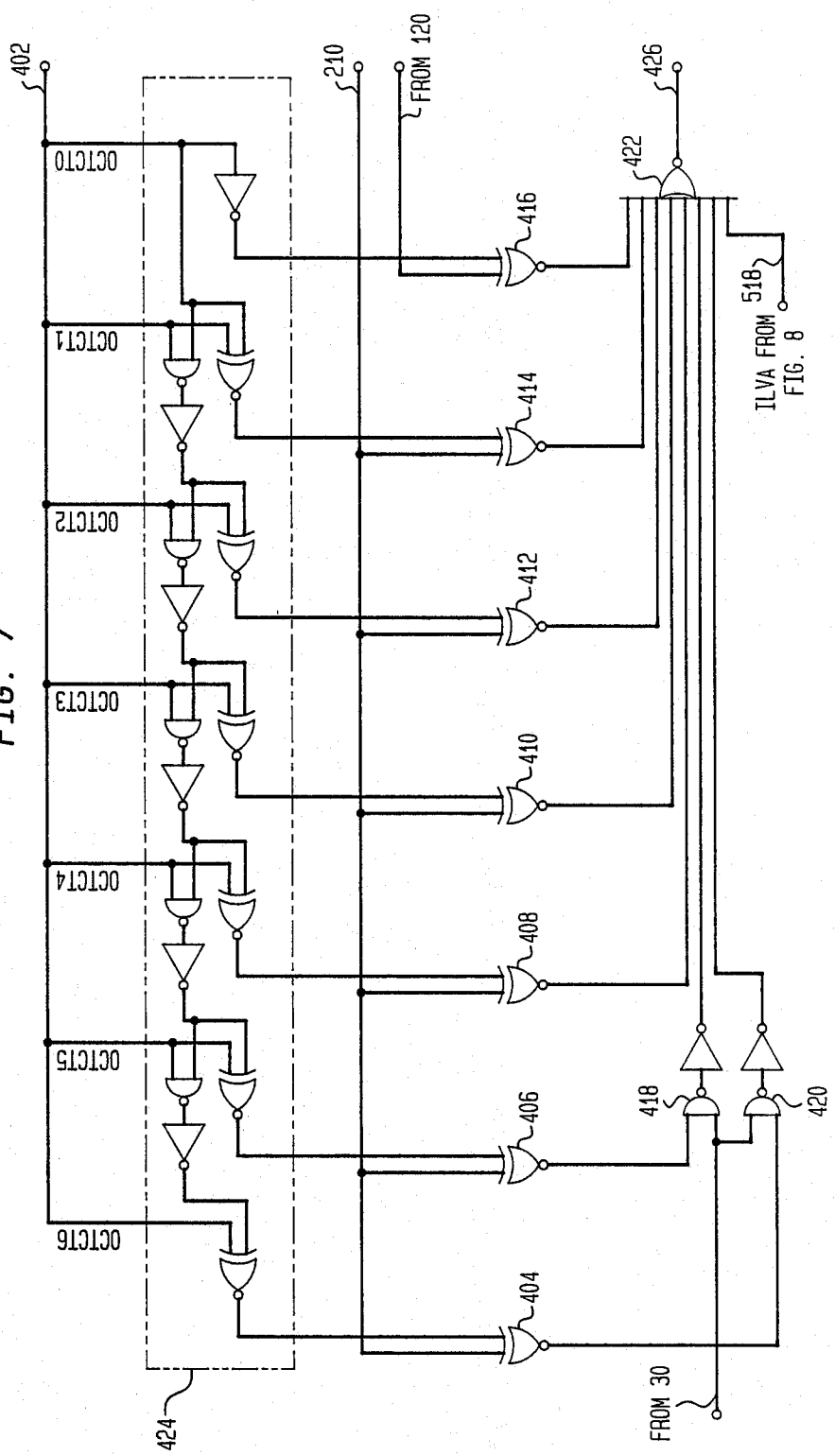
FIG. 7 is a circuit diagram of a portion of a detector circuit useful in connection with the present invention.

FIG. 7 illustrates generally at 400 the portion of detector 20 of FIG. 3 shown by functional block 26 of FIG. 2. The current octet count from 134 is input on line 402. The PCM data bus 210 couples data to a comparator comprised of exclusive OR gates 404 through 416, and gates 418, 420 and 422. The comparison is between the PCM data 210 and the current octet count plus one. An adder circuit 424 adds "one" to the current octet count. The output on line 426 is the logic output of the comparator 26.

Figure 8:
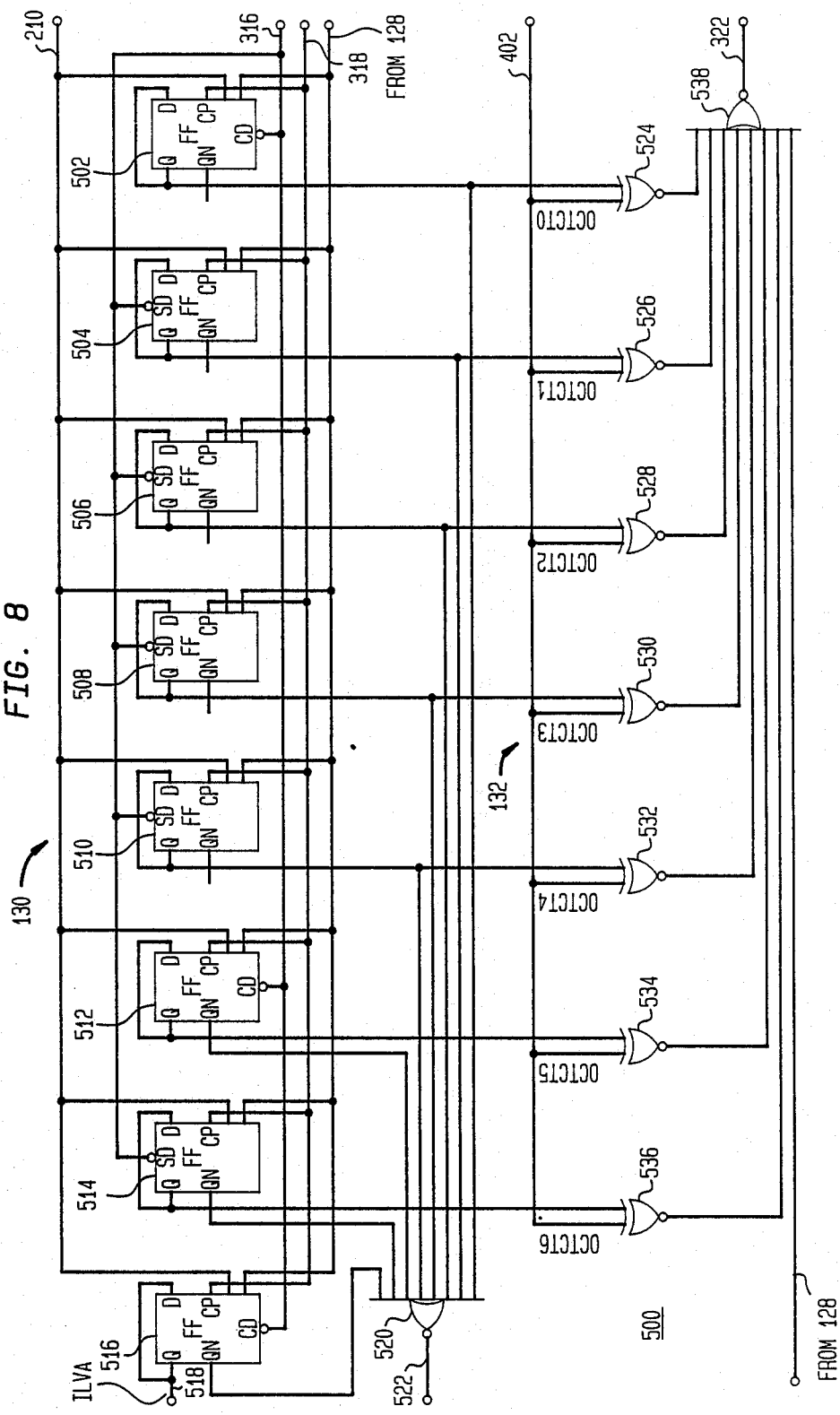
FIG. 8 is a circuit diagram of a latch and comparator circuit useful in connection with the present invention.

FIG. 8 illustrates latch 130 and comparator 132 generally at 500 in logic implementation. The eight bit latch 130 is comprised of flip flops 502, 504, 506, 508, 510, 512, 514, and 516 where 502 through 514 carry the VAZO address and 516 carries the indication of the last VAZO address, the ILVA bit. PCM data on line 210 is coupled into latch 130. The output of flip flop 516, the ILVA bit on line 518 is coupled to comparator 26 within the error detector 20, and is shown on FIG. 7 as an output to gate 422. A NOR gate 520 has input thereto the Q and QN (inverted data) outputs of flip flops 502 through 516 and derives a control output on line 522 that will be described with reference to the control logic 128. The data (Q) output of flip flops 502 through 514 are coupled to comparator 132, which is comprised of exclusive OR gates 524 through 536, which perform an exclusive OR operation on its data output of the flilp flops with the current octet count on line 402 to derive as an output 322 an indication of equality between the current octet count and the value in latch 130. The outputs of gates 25 through 536 are NORed at gate 538.

Figure 9:
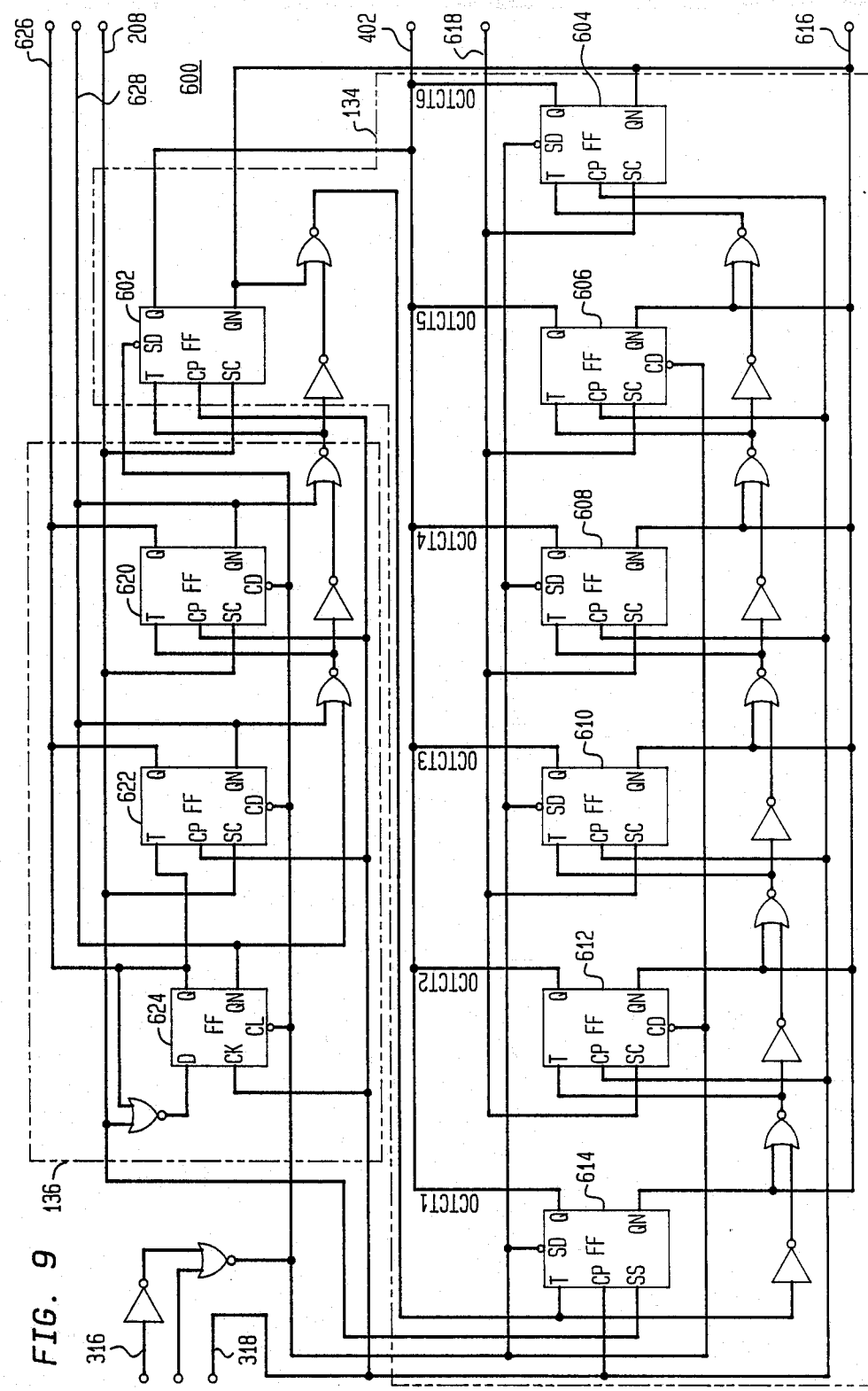
FIG. 9 is a circuit diagram of an octet counter and divide-by-eight counter circuit useful in connection with the present invention.

FIGS. 9 illustrates the octet counter 134 and the divide-by-eight counter 136. Counter 134 is comprised of flip flops 602 through 614 and is essentially a binary counter having toggle flip flops with synchronous clear or synchronous sets. The data outputs are at 402 while the inverted data outputs are at 616. A reset input in at 618. Counter 136 is a standard binary counter comprised of flip flops 620, 622 and 624 and has its data output at 626 and 628 to the control logic 128.

Figure 10:
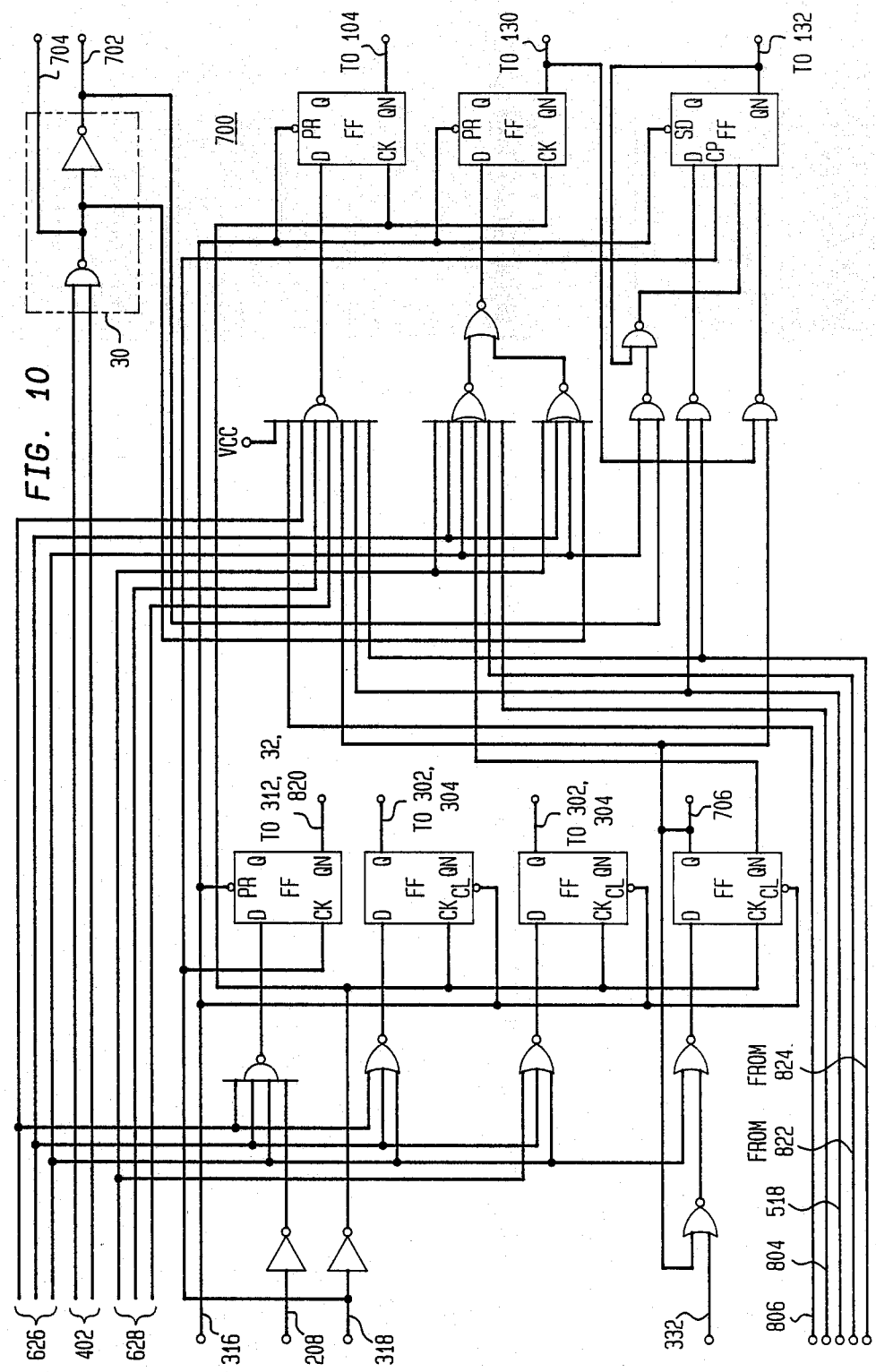
FIG. 10 is a circuit diagram of a control circuit for use in checking the current octet number, in accordance with the present invention.

FIG. 10 is portion of control circuit 128 having a portion of the error detector 20 therein shown generally at 700 which implements the function of checking to determine if the current octet in number 96, as shown generally in FIG. 2 by block 30. The current octet count on line 402 is decoded at 30, which includes an AND circuit. Other control signals for the decoder functios are generated as shown i.e., generation of octet boundary information and other internal timing and control signals which are coupled internally as illustrated. The signal 706 provides a wider pulse from the comparator 132. The outputs of the block 30 are 702 and 704 which are coupled to the error detector 300 and to the control 128. The various logic inputs and outputs are as shown.

Figure 11B:
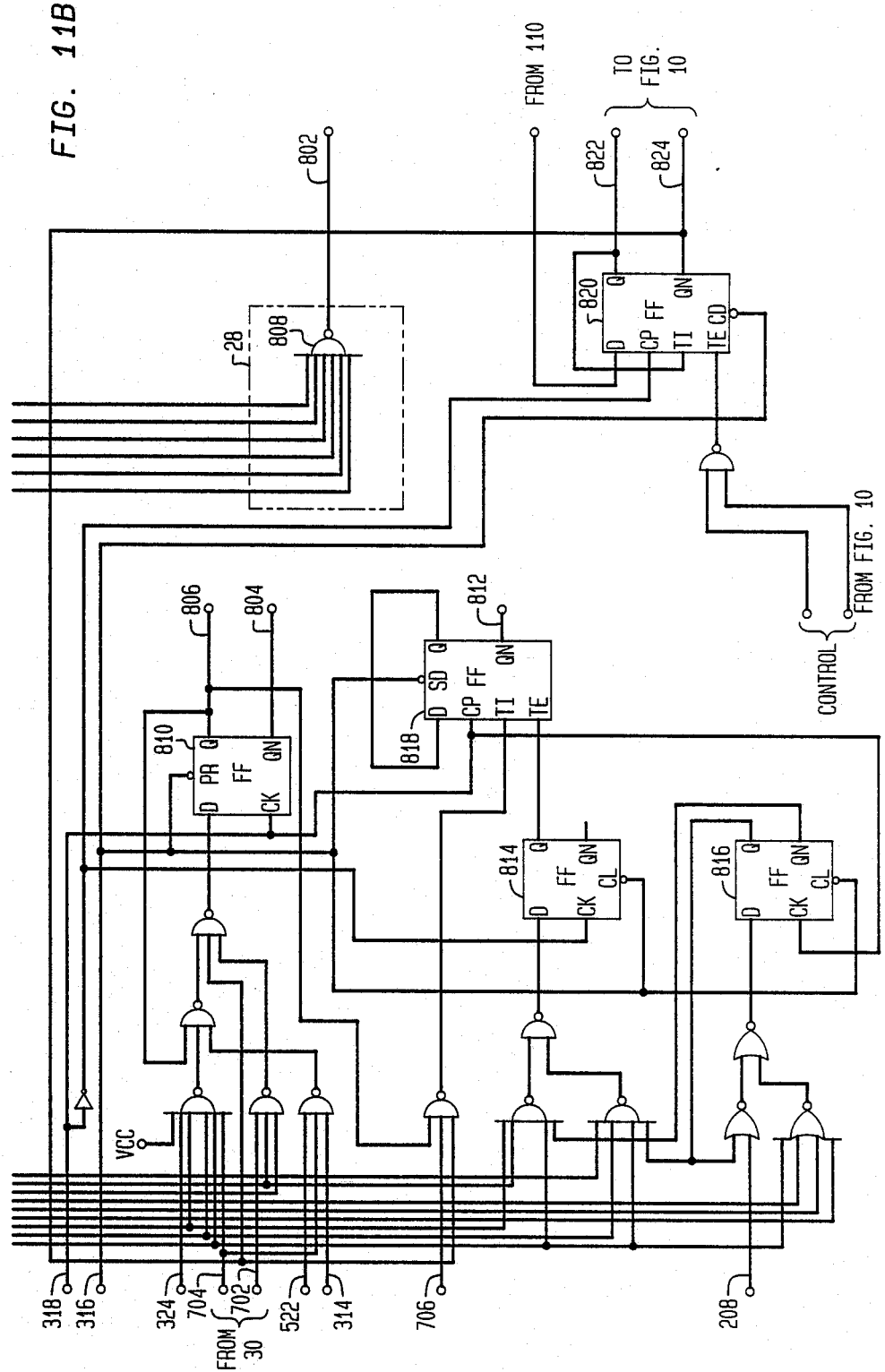

FIG. 11 illustrates additional control logic 128 generally at 800, and includes a portion of the error detector 20 implemented by block 28 of FIG. 2. The counter of FIG. 11 checks to determine if the current octet is octet 95. The current octet number in line 402 is decoded at NAND gate 808. The output of NAND gate 808 on line 802 is th indication of whether the current octet is octet 95 or not. Flip flop 810 finally determines whether there is an error in the 96 octet group, and the iddication of the error is output on line 804, with its inverse indication output on line 806. The output on line 812 is the input signal used to reset VAZO's to "all zeros" by masking bits to gate 125 as shown in FIG. 3. Tee masking signal on line 812 is generated at flip flops 814, 816, and 818. The output of flip flop 820 is an indication of the Z-bit value for the current 96 octet group. Various timing and test connections which are routine logic implementations have not been described in the figures to avoid undue complexity of description.

FIG. 12 illustrates examples of VAZO conditions. FIG. 12(A) shows a string of fifteen zeros. FIG. 12(B) shows an adjacent octet of less than two logic "ones," which is a violation of the ones density criteria. FIG. 12(C) shows two adjacent "all zero" octets, both of which are VAZOs.

FIGS. 13(A), 13(B), and 13(C) show examples of valid VAZO locations at the decoder. If the 13(A) middle octet wrre "all zeros" it would violate the zero string constraint. The octet is shown valid and will be processed. If the middle octet of 13(B) were all zeros it would be a VAZO because it would combine with its following octet to violate the "ones density" requirement. It is a valid VAZO and is processed. FIG. 13(C) illustrates that if octet number 47 contains an address of octet 48, it means that there could have been adjacent "all zero" octets, therefore octet 47 is valid and would be processed. Octet 48 is also a valid location because octet 47 was a valid VAZO.

While the present invention has been described in connection with a preferred embodiement thereof, it is to be understood that additional embodiments, modifications, and applications that wil become apparent to those skilled in the art are included within the spirit and scope of the invention as set forth by the claims appended hereto.

What is claimed is:

1. The method of detection of data transmission errors in decoding of Zero-Byte Time Slot Interchange (ZBTSI) data, in PCM data transmission comprising the steps of:
   decoding data bytes of said PCM data transmission such that each individual data byte and the data bytes immediately preceding and immediately following said individual data byte are also decoded; and wherein said data bytes are each individual octets having eight logic bits which data bytes are arranged in 96-octet groups;
   examining said immediately preceding and immediately following data bytes to determine whether the combination of said decoded individual data byte and either or both of said immediately preceding or immediately following data bytes violates a predetermined criteria; and
   deriving a signal indicative of a transmission channel error when said predetermined criteria is violated;
   wherein said predetermined criteria includes the conditions:
   (a) said individual octet contains eight logic zeros, and
   (b) the combination of said individual octet with the immediately preceding and immediately following octets violates the DS1 ones-density criteria.

2. A method in accordance with claim 1 wherein said predetermined criteria includes the conditions:
   (a) said individual octet contains eight logic zeros, and
   (b) the combination of said individual octet with the immediately preceding and immediately following octets forms a zero string of a predetermined number of zeros or lonǵer.

3. A method in accordance with claim 2 wherein said predetermined number of zeros is fifteen.

4. A method in accordance with claim 1 wherein said predetermined criteria includes the condition that:
   said individual octet and either of the adjacent octets thereto are all-zero octets.

5. A method in accordance with claim 1 further comprising the step of:
   processing said individual data byte such taht it is coupled into the PCM data transmission when said signal indicative of a channel error is not present, and inhibiting further processing of said individual data byte when said signal indicative of a transmission channel error is present, thereby eliminating error multiplication by partial error correction.

6. A ZBTSI decoder having an improved error correction capability comprising:
   means for receiving a PCM data input of ZBTSI encoded telecommunications information, including means for temporarily storing a current octet and the two adjacent octets of said ZBTSI encoded information;
   error detector means for examining the two adjacent octets to determine whether their combination with the current octet is a violation of a predetermined logic criteria; and for deriving an error output signal when a violation is present,
   comparator means for comparing an indicated address of the current octet with the actual address of the current octet, and generating an output indicative of whether there is a match;
   control means for causing said current octet to be processed as valid data when an error output signal is present only when the output of the comparator is indicative of a correct address of said current octet.

7. A ZBTSI decoder in accordance with claim 6 further comprising:
   further control means for inhibiting further processing of said current octet when the output of said comparator indicates an incorrect current octet address.

8. A ZBTSI decoder in accordance with claim 7 further including means for continuously clocking groups of data bytes through said receiving means such that by inhibiting processing of erroneous octet address locations of violations of predetermined logic criteria, only valid address chains are processed, thereby optimizing the error correction capability of said decoder.

9. A ZBTSI decoder in accordance with claim 8 further including means for inhibiting processing of all of the data bytes in group of data bytes following a current octet in which processing is inhibited.

10. A ZBTSI decoder in accordance with claim 9 wherein each group of data bytes includes 96 data bytes, each byte having 8 bits.

11. A ZBTSI decoder in accordance with claim 10 further including:
   means for determining whether the current octet is octet number 96;
   means for storing the address of the first octet in violation of said predetermined criteria in said 96 octet group;
   means for inserting said stored address of said first octet in violation of said predetermined criteria as the contents of octet number 96 when an error is detected; and
   means for inhibiting processing of the remainder of the addresses in said 96 octet group upon detection of said error, whereby the first octet received by the decoder in every 96 octet group is either octet number 96 or the address of the first octet in the group in violation of said predetermined criteria.

12. A ZBTSI decoder in accordance with claim 11 having an error multiplication value of 1.004 times the bit error rate of the PCM transmission channel.

13. A ZBTSI decoder in accordance with claim 6 wherein said temporary storing means comprises a shift register.

14. A ZBTSI decoder in accordance with claim 6, wherein said decoder is implemented in CMOS logic.

15. A ZBTSI decoder in accordance with claim 6 wherein said predetermined criteria includes the ones density criteria.

16. A ZBTSI decoder in accordance with claim 6 wherein said predetermined criteria includes the occurrence adjacently of a zero string equal to or greater than a predetermined number.

17. A ZBTSI decoder in accordance with claim 16 wherein said predetermined number is fifteen.

18. A ZBTSI decoder in accordance with claim 6 wherein said predetermined criteria includes the occurrence adjacently of two all zero octets.

* * * * *